United States Patent [19]
Stadler et al.

[11] Patent Number: 5,287,300
[45] Date of Patent: Feb. 15, 1994

[54] THREE-DIMENSIONAL MAGNETIC BUBBLE MEMORY SYSTEM

[75] Inventors: Henry L. Stadler, La Canada; Romney R. Katti, Pasadena; Jiin-Chuan Wu, San Gabriel, all of Calif.

[73] Assignee: California Institute of Technology, Pasadena, Calif.

[21] Appl. No.: 893,823

[22] Filed: Jun. 4, 1992

[51] Int. Cl.$^5$ .............................. G11C 19/08
[52] U.S. Cl. .......................... 365/10; 365/122
[58] Field of Search ............ 365/10, 122; 369/13

[56] References Cited

U.S. PATENT DOCUMENTS

| | | | |
|---|---|---|---|
| 4,660,173 | 4/1987 | Mehdipour | 365/10 |
| 5,185,716 | 2/1993 | Mehdipour | 365/10 |

Primary Examiner—Joseph A. Popek
Attorney, Agent, or Firm—Leonard Tachner

[57] ABSTRACT

A compact memory uses magnetic bubble technology for providing data storage. A three-dimensional arrangement, in the form of stacks of magnetic bubble layers, is used to achieve high volumetric storage density. Output tracks are used within each layer to allow data to be accessed uniquely and unambiguously. Storage can be achieved using either current access or field access magnetic bubble technology. Optical sensing via the Faraday effect is used to detect data. Optical sensing facilitates the accessing of data from within the three-dimensional package and lends itself to parallel operation for supporting high data rates and vector and parallel processing.

15 Claims, 8 Drawing Sheets

THREE-DIMENSIONAL MAGNETIC BUBBLE MEMORY SYSTEM

ORIGIN OF INVENTION

The invention described herein was made in the performance of work under a NASA contract, and is subject to the provisions of Public Law 96-517 (35 USC 202) in which the contractor has elected to retain title.

TECHNICAL FIELD

The present invention relates generally to the field of magnetic bubble memory technology and more specifically to a three-dimensional magnetic bubble memory system that is compact, radiation hard and which achieves high volume storage density without significant complexity.

BACKGROUND ART

In many applications, nonvolatile, secondary memory is achieved by using magnetic disk recording. While areal density improvements are underway in magnetic recording, the fact that they are mechanical systems limits their reliability, volumetric data storage capacity, access time, data rate, and usefulness in harsh environments such as in spaceflight.

U.S. Pat. No. 4,660,173 and published reports describe a means for achieving three-dimensional storage using magnetic bubble technology for storage and magneto-optic sensing for readout. These published reports are the following:

1. F. Mehdipour, U.S. Pat. No. 4,660,173, "Three Dimensional Magnetic Bubble Data Storage and Optical Retrieval System.";
2. A. J. Mendez and F. Mehdipour, "Three Dimensional Mass Memory Compatible with Parallel Processing Architectures," Accepted for publication, IEEE Fourth Annual Symposium on Parallel Processing;
3. "Firm Developing optical Media Based on Magnetic Bubble Technology." Optical Memory News, October, 1989, Rothchild Consultants, San Francisco;
4. F. Mehdipour and H. Bagherzadeh, "New Memory Technology Supports Parallel Processing," Defense Electronics, Volume 22, Number 11, November 1990, pp. 55-58.

Figure 1:
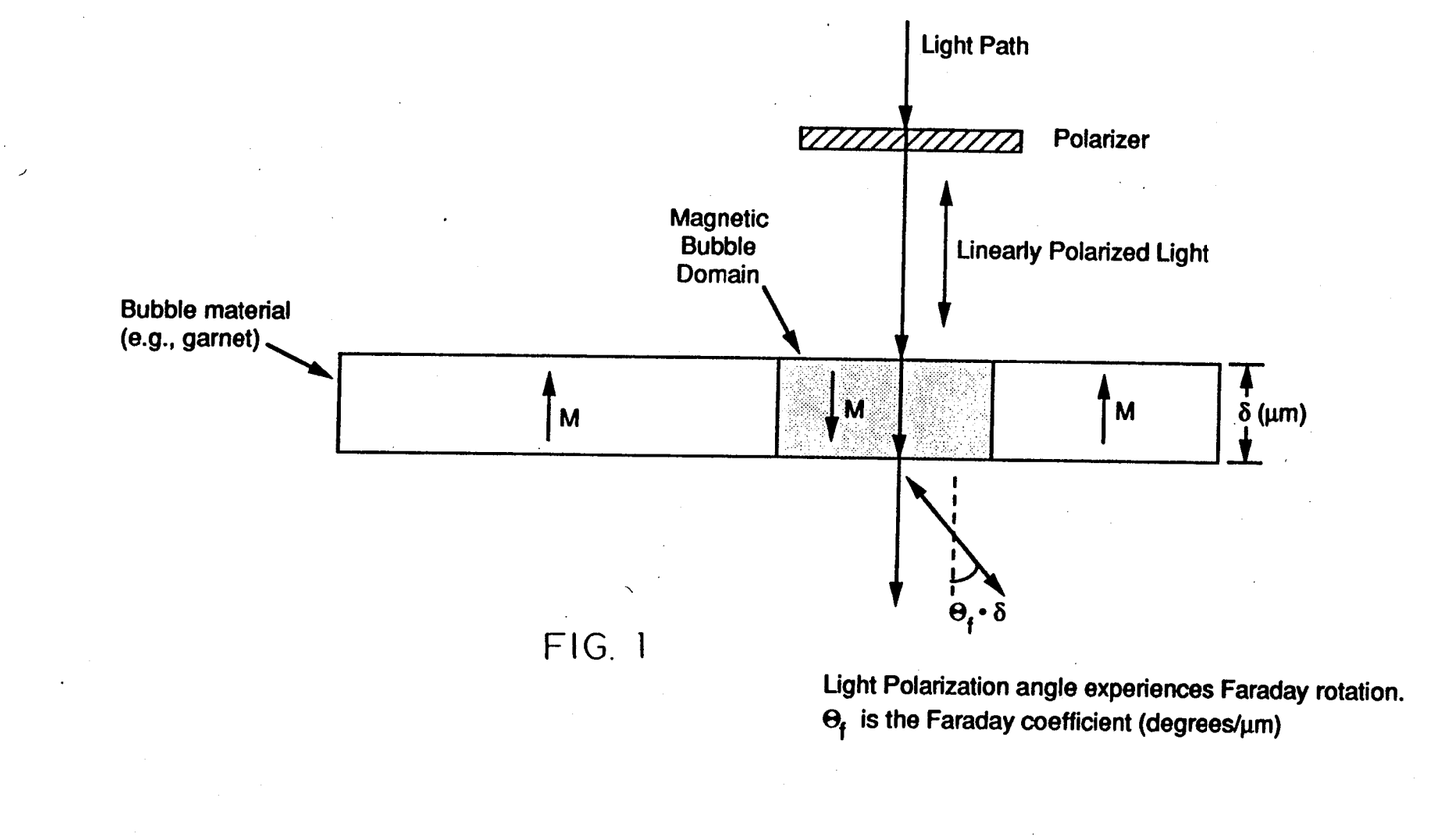
FIG. 1 is a depiction of prior art readout of a magnetic domain using the magneto-optic Faraday effect.
Figure 2:
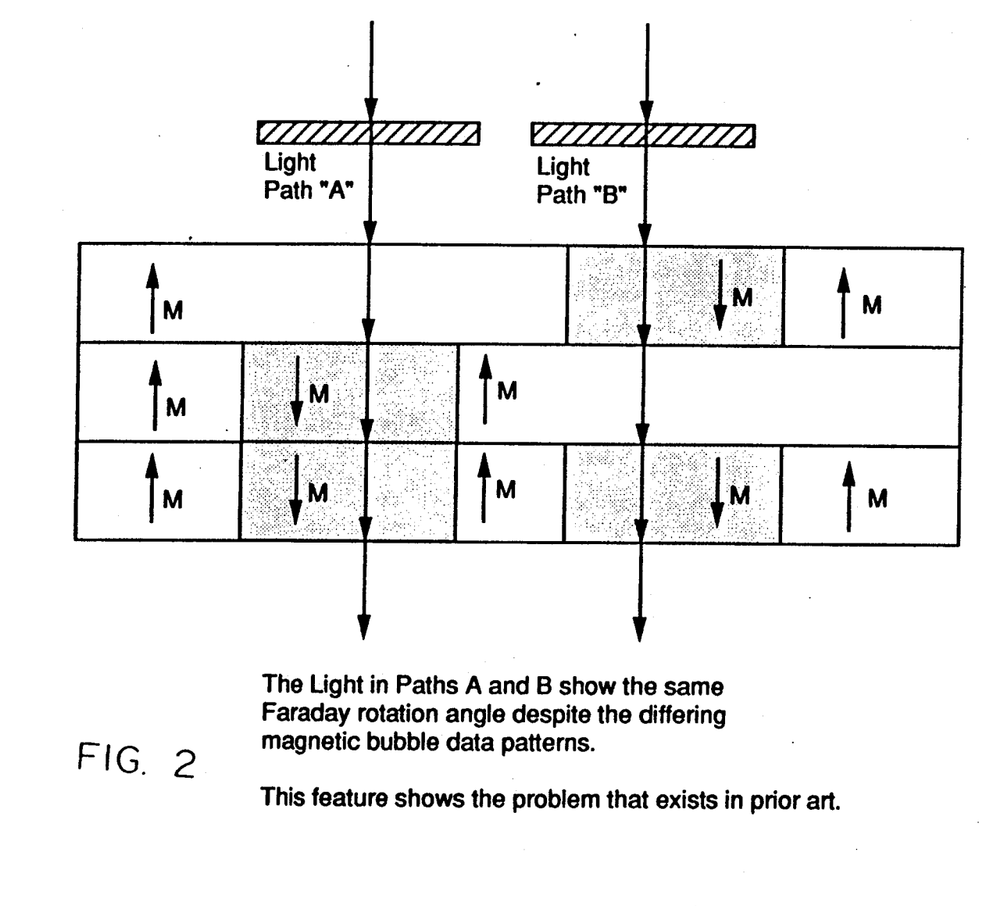
FIG. 2 is a depiction of the prior art generation of non-unique readout states when using the magneto-optic readout.

However problems exist in the two methods that comprise the current state of the art. First, in one method, the optical path is common along one axis to the storage layers. Such a system is simple, and uses the Faraday effect, as depicted in FIG. 1, in which the polarization of the incident, linearly polarized light is rotated in one sense or the opposite, depending upon the direction of magnetization. However, as shown in FIG. 2, since only the net Faraday rotation can be measured at an output, the data at each of the bit locations along the optical path cannot be uniquely recovered. Thus, proper readback cannot occur as described in the prior art.

A second method in the prior art places a single magnetic bubble layer between two layers which serve as optical waveguides. Such an arrangement allows data to be recovered uniquely since unique optical paths are provided, but this capability is achieved at the expense of considerable material and processing complexity. This additional complexity may degrade memory performance to an unacceptable level since the physical stresses and temperature dependencies encountered during device processing for such a module are significant. The relatively high temperatures needed to fabricate the optical waveguide layers are likely to stress and alter the magnetic bubble storage material, which often is an epitaxially grown garnet crystal containing a variety of rare-earth constituents and is fabricated using relatively low-temperature processes. These problems can change the anisotropy, mobility, magnetization, characteristic length, etc. of the bubble film, and affect the operational storage and propagation functions. (See for example P. H. L. Rasky, D. W. Greve, and M. H. Kryder, "The Feasibility of Silicon on Garnet Technology," Journal of Applied Physics, Volume 57, Number 1, Apr. 15, 1985, pp. 4077-4079) A general text in the relevant art is "Magnetic Bubble Technology" by A. H. Eschenfelder, 2nd Edition, 1981 published by Springer-Verlag, Berlin/New York.

STATEMENT OF THE INVENTION

The solution to these problems, as described below, is to construct a module that, first, can store a two-dimensional array of bubbles. Second, when addressed, each module must be able to position the selected magnetic bubbles in the minor loops such that data can still be uniquely recovered when the three-dimensional memory is assembled. Features such as conductors and grooves are added to the bubble storage material to manipulate magnetic bubbles and to support the data access functions.

A plurality of modules, in the form of layers, are formed as a "sandwich" placed between a light source and a data detector. In the disclosed embodiment, the light source comprises an array of laser diodes and a polarizer and the detector comprises an analyzer and an array of photodetectors. One disclosed embodiment employs field-access propagation technology such as NiFe permalloy "T" and "I" shaped bars to sequentially propagate the bubbles along the minor loops and uses a non-destructive replication in an output track to the bubble viewing area. A second disclosed embodiment substitutes current-access technology wherein a pair of conductors apply local propagating magnetic fields. Current-access technology may be preferred for faster operating speed and lower power consumption.

The invention is solid-state and radiation hard. These features are expected to enhance reliability, into the hundreds of thousands of hours of operation before failure, and facilitate use in computer systems in harsh environments including spaceflight. The relative simplicity of this system is expected to eliminate potential problems that are present in the prior art and will facilitate mass manufacturing.

OBJECTS OF THE INVENTION

It is therefore a principal object of the present invention to provide an improved three-dimensional magnetic bubble memory with optical sensing and which overcomes the aforementioned disadvantages of the prior art.

It is an additional object of the invention to provide a three-dimensional magnetic bubble memory which allows data to be recovered uniquely without the use of optical waveguides.

It is an additional object of the invention to provide a three-dimensional magnetic bubble memory wherein a plurality of modules are sandwiched between a light source and a detector for viewing replicated bubbles in an output track using the Faraday effect.

It is still an additional object of the invention to provide a three-dimensional magnetic bubble memory in the form of stacked layers, each having an output track to permit unique and unambiguous detection of data by optical sensing.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment of the invention when taken in conjunction with the following drawings in which.

DETAILED DESCRIPTION OF THE INVENTION

Figure 3:
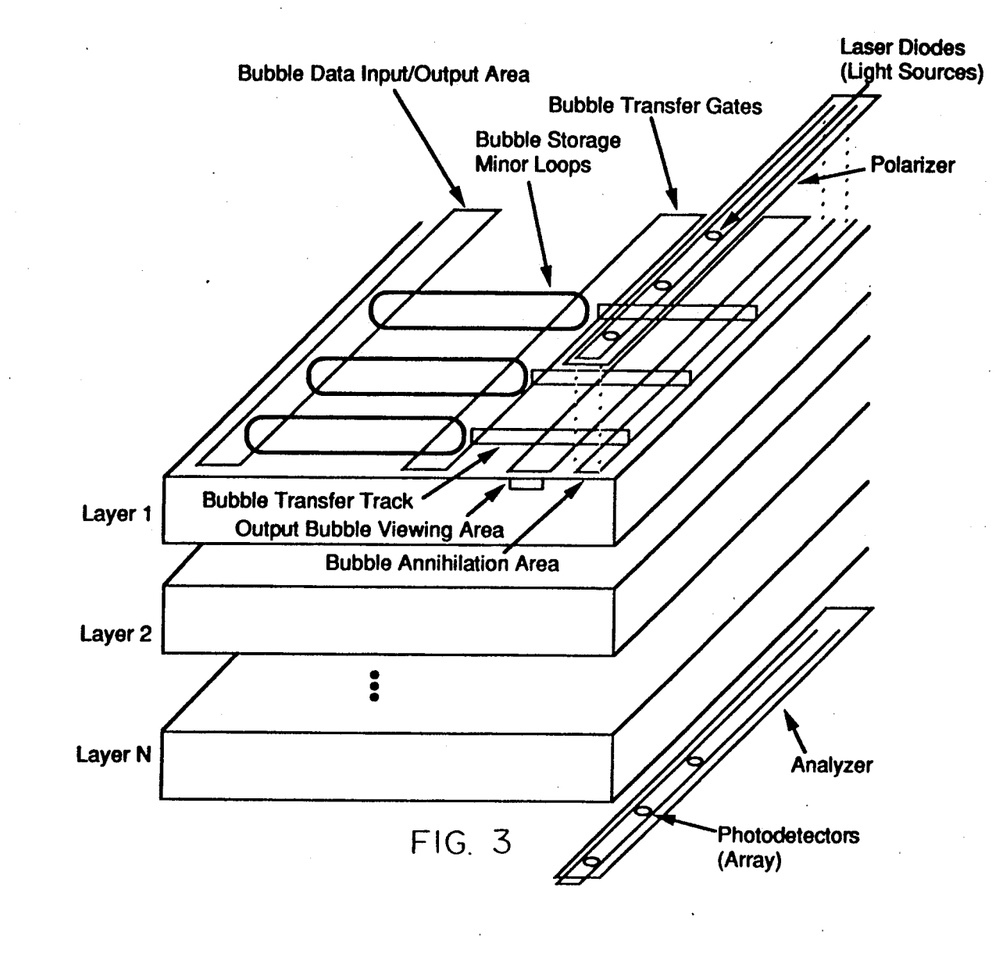
FIG. 3 is a three-dimensional view of a three-dimensional magnetic bubble memory using magneto-optic readout in accordance with the present invention.

Shown in FIG. 3 is a plurality of modules in layers that comprise the three-dimensional memory of the present invention. The magnetic bubble modules form a sandwich that is placed between an array of laser diodes and a polarizer on one side and an analyzer and an array of photodetectors on the other side. The diodes and polarizer serve as a light source and the analyzer and photodetectors serve as data detectors.

Depicted on the top of the top module in FIG. 3 are the bubble minor loops that are used to store data, and the schematic input and output tracks. A schematic top view of one of the modules is shown in FIG. 4.

Figure 4:
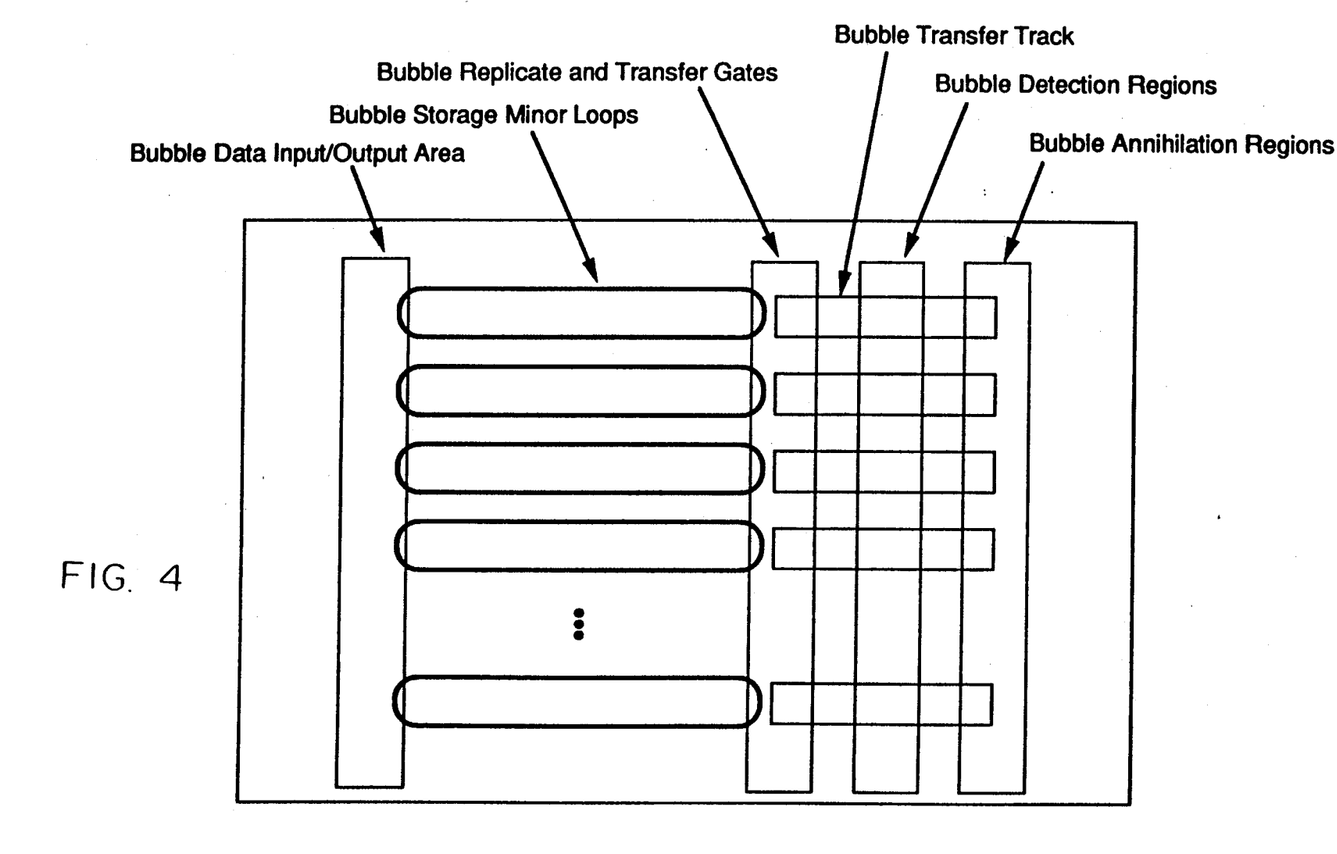
FIG. 4 is a schematic areal layout of a module for the three-dimensional magnetic bubble memory of FIG. 3.
Figure 5:
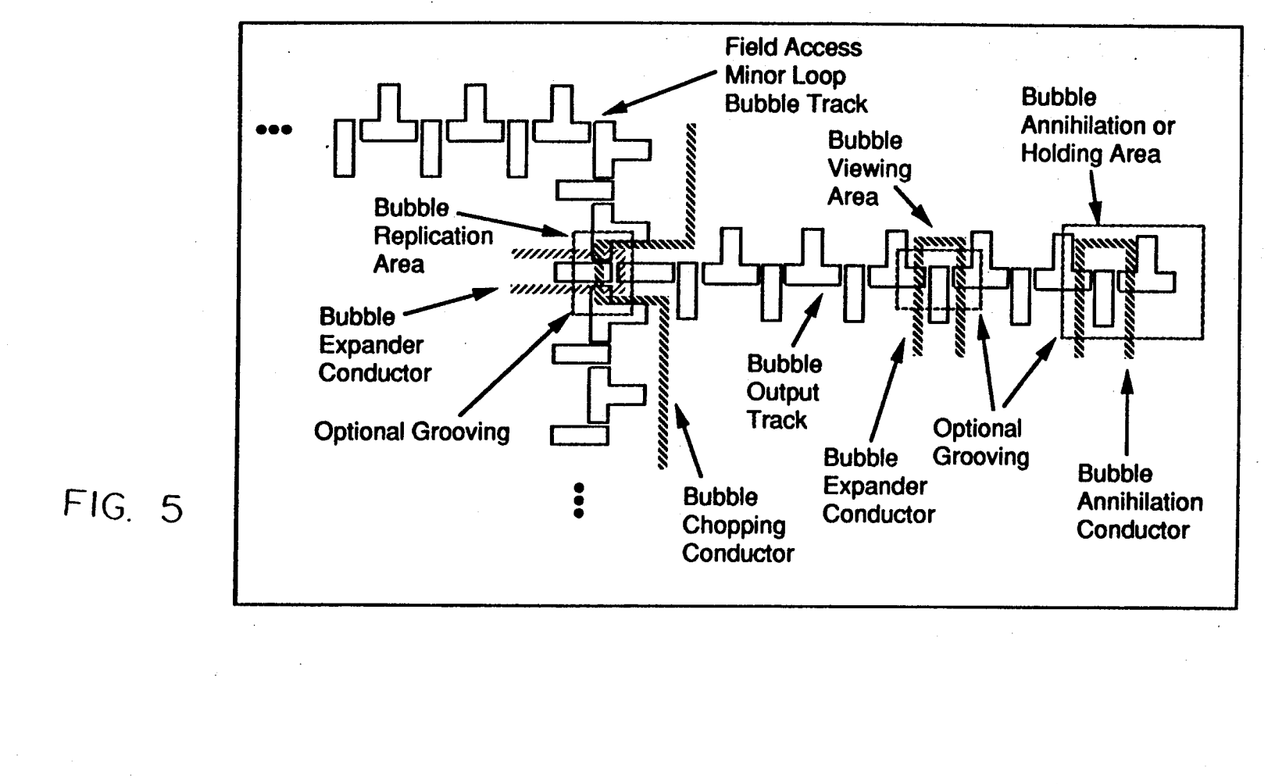
FIG. 5 is an areal layout of a minor loop section and the corresponding output stage implemented in field-access propagation technology.

Shown in FIG. 5 is a more detailed, sample layout, corresponding to FIG. 4, implemented using field-access propagation technology. The "T" and "I" shaped bars correspond to highly permeable magnetic material, such as NiFe permalloy. Because field-access technology uses an effective rotating magnetic field, the bars magnetize in sequence to propagate bubbles around the minor loop that is shown in part in FIG. 5. A conductor is shown that is used to expand a bubble that is positioned at the beginning of the output track in the selected module layer. Alternatively, grooving may be used to expand the bubble passively. The bubble, if present, is replicated nondestructively so that the original bubble remains in the minor loop while a copy is sent along the output track. Note that if no bubble is present, no bubble remains in the minor loop and no bubble is propagated into the output track, so that the binary data content is maintained.

Given that a bubble is placed into the output track, the bubble is propagated toward the bubble viewing area that is in the light path. A current is applied if necessary to increase the diameter of the bubble to improve signal-to-noise ratio. Alternatively, grooving may be used to expand the bubble. The time the bubble spends in the viewing cell because of propagation will be approximately between 100 nanoseconds and 1 microsecond, which is sufficient in practice to detect the presence or absence of a bubble. After passing through the bubble viewing area, the bubble continues to propagate. At this point, the bubble is no longer needed. So that the bubble will not interfere with further device operation, the bubble is either annihilated with a conductor, or placed in a bubble holding region that is created, for example, using grooved material.

Figure 6:
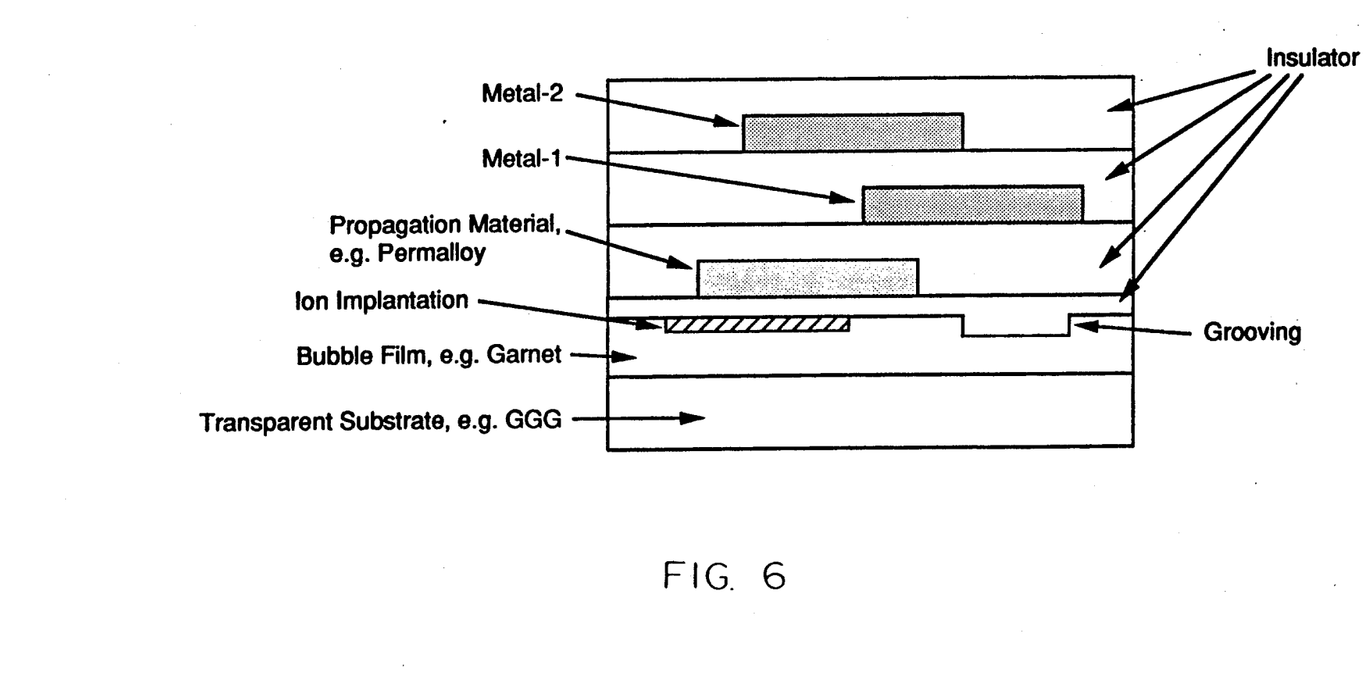
FIG. 6 is a cross-sectional view of magnetic bubble memory module using field-access propagation technology.

A sample device cross-section is shown in FIG. 6. Two metal layers are shown to allow for two levels of conductors to allow overlaying conductors and to simplify routing. The layer containing the highly-permeable propagation material for controlling the bubbles' positions is shown next. The bubble film is shown on its substrate. The bubble film near the bubble minor loops may be ion implanted to suppress hard bubble formation. The bubble material may also be grooved, for example, to adjust bubble diameter, size, and shape; and to stabilize bubbles and to hold bubbles in place.

Figure 7:
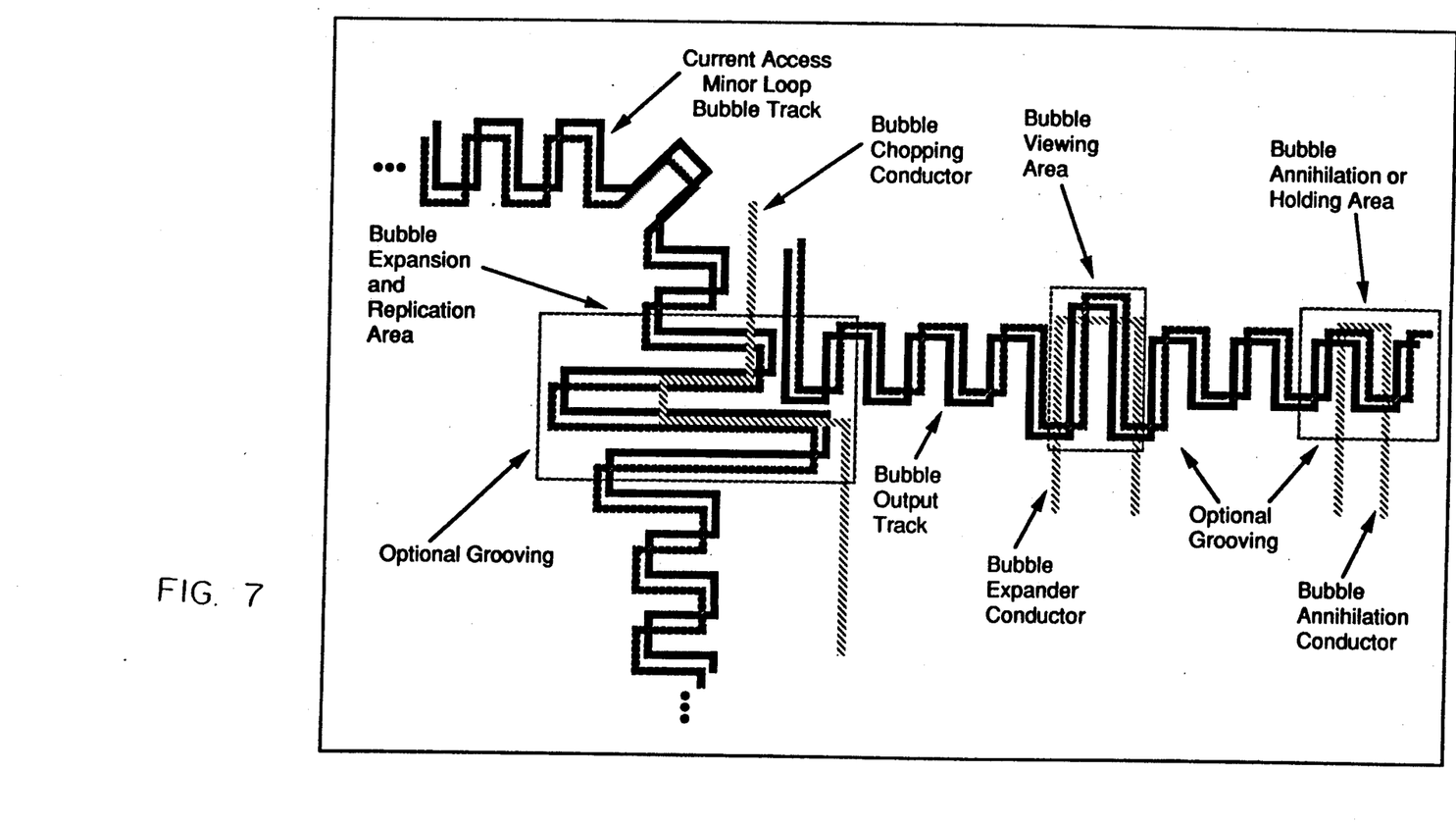
FIG. 7 is an areal layout of a minor loop section and the corresponding output stage implemented in current-access propagation technology.

Because rotating magnetic fields can limit device operating speed and consume relatively high levels of power, often current-access technology is preferred. In current-access technology, the highly permeable magnetic material is replaced by a pair of conductors that apply propagating magnetic fields locally, as shown in FIG. 7. The replication, viewing, and eradication of bubbles can be handled with conductors and/or grooving in a manner analogous to that described above and in FIG. 5.

Figure 8:
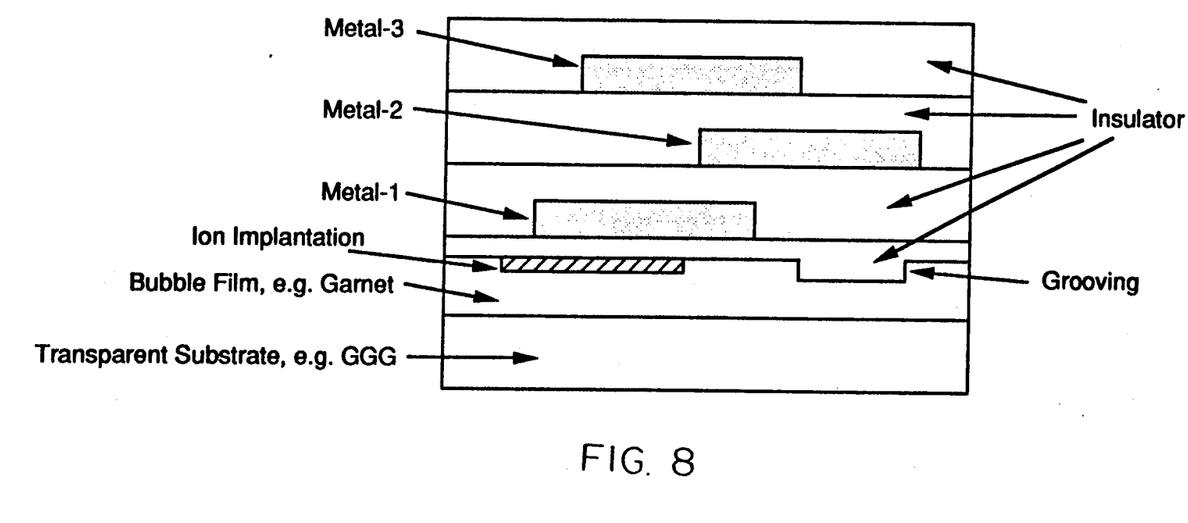
FIG. 8 is a cross-sectional view of magnetic bubble memory module using current-access propagation technology.

FIG. 8 shows a sample current access device cross-section for the layout depicted in FIG. 7. In essence, three metal layers are used to replace the two metal layers and the one highly permeable layer that are used in field-access devices.

It will now be understood that what has been disclosed herein comprises a novel three-dimensional magnetic bubble memory in which stacked modules each having an output track, are combined with a light source in the form of an array of laser diodes and a polarizer and with a detector in the form of an array of photodetectors and an analyzer. The result is a highly compact, non-complex, high volumetric storage density memory with fast, unique and unambiguous data access. Those having ordinary skill in the relevant art will understand that the disclosed embodiments are exemplary only and are not necessarily limiting of the scope of protection afforded hereby.

Accordingly, what is claimed is:

1. A three-dimensional magnetic bubble memory comprising:
   a three-dimensional stack formed of a plurality of magnetic bubble memory modules stacked in contiguous abutting relation, one immediately adjacent another without intermediate non-memory layers;
   a source of linearly polarized light positioned at one end of said stack; and
   a detector of Faraday-rotated light positioned at an opposite end of said stack;
   each such module having a magnetic bubble viewing area in line with said light source and said detector and having a storage area and an output track for transferring a bubble replication from said storage area to said viewing area for detection therein.

2. The magnetic bubble memory recited in claim 1 wherein said light source comprises an array of laser diodes and a polarizer.

3. The magnetic bubble memory recited in claim 1 wherein said detector comprises a polarization analyzer and an array of photodetectors.

4. The magnetic bubble memory recited in claim 1 further comprising a conductor in each said viewing area for expanding a bubble to be detected.

5. The magnetic bubble memory recited in claim 1 further comprising a groove in each said viewing area for altering the size and shape of a bubble to be detected.

6. The magnetic bubble memory recited in claim 1 further comprising a conductor in each said output track for expanding a bubble to be detected.

7. The magnetic bubble memory recited in claim 1 further comprising field-access propagation technology means for propagating a bubble in each said module.

8. The magnetic bubble memory recited in claim 1 further comprising current-access propagation technology means for propagating a bubble in each said module.

9. A three-dimensional magnetic bubble memory comprising:

a stack of contiguous, abutting magnetic bubble memory modules, each such module immediately adjacent another module; a source of polarized light and a light detector; said source of light, said stack and said detector being optically aligned whereby said light passes through said modules to said detector;

means in each said module for propagating a bubble into a selected region through which said light passes for detecting said bubble, whereby the presence or absence of a bubble in said selected region provides a readout of each module.

10. The magnetic bubble memory recited in claim 9 wherein said light source comprises an array of laser diodes and a polarizer.

11. The magnetic bubble memory recited in claim 9 wherein said detector comprises a polarization analyzer and an array of photodetectors.

12. The magnetic bubble memory recited in claim 9 further comprising a conductor in each said selected region for expanding a bubble to be detected.

13. The magnetic bubble memory recited in claim 9 further comprising a groove in each said selected region for altering the size and shape of a bubble to be detected.

14. The magnetic bubble memory recited in claim 9 further comprising field-access propagation technology means for propagating a bubble in each said module.

15. The magnetic bubble memory recited in claim 9 further comprising current-access propagation technology means for propagating a bubble in each said module.

* * * * *